United States Patent [19]

Finkbeiner et al.

[11] Patent Number: 5,384,201
[45] Date of Patent: Jan. 24, 1995

[54] TOOL FOR TREATING SURFACES OF STRUCTURAL PARTS AND CARRIER MATERIAL FOR THE SAME

[75] Inventors: Ludwig Finkbeiner, Walheim; Manfred Wilhelm, Nussdorf, both of Germany

[73] Assignee: Robert Bosch GmbH, Stuttgart, Germany

[21] Appl. No.: 33,033

[22] Filed: Mar. 18, 1993

Related U.S. Application Data

[63] Continuation-in-part of Ser. No. 864,616, Apr. 7, 1992, Pat. No. 5,233,738.

[30] Foreign Application Priority Data

May 31, 1991 [DE] Germany ............... 4117814
Sep. 28, 1992 [DE] Germany ............... 4232429

[51] Int. Cl.⁶ ........................... B22F 5/00
[52] U.S. Cl. ........................ 428/552; 428/551; 428/553; 428/554
[58] Field of Search .......... 428/552, 553, 554, 551

[56] References Cited

U.S. PATENT DOCUMENTS

| | | | |
|---|---|---|---|
| 3,833,360 | 9/1974 | Giflu et al. | 75/126 R |
| 4,427,626 | 1/1984 | Petrov et al. | 419/28 |
| 4,497,874 | 2/1985 | Hale | 428/551 |
| 4,618,540 | 10/1986 | von Holst et al. | 428/552 |
| 4,649,084 | 3/1987 | Hale et al. | 428/552 |
| 5,079,100 | 1/1992 | Descamp et al. | 428/552 |
| 5,233,738 | 8/1993 | Finkbeiner et al. | 29/90.01 |

FOREIGN PATENT DOCUMENTS

| | | |
|---|---|---|
| 0515868 | 2/1992 | European Pat. Off. |
| 2431448 | 6/1975 | Germany . |
| 3503105 | 7/1986 | Germany . |
| 3809139 | 9/1989 | Germany . |

OTHER PUBLICATIONS

W. Schintlemeister, et al, "Hartstoffbeschichtete Werkzeuge-Verschleissverhalten Anwendung Und Herstellung", Jul. 19, 1984, pp. 874–880.

*Primary Examiner*—Donald P. Walsh
*Assistant Examiner*—John N. Greaves
*Attorney, Agent, or Firm*—Michael J. Striker

[57] ABSTRACT

A carrier material for a tool for treating surfaces is composed of a metal alloy with a homogeneous, fine-grained structure. The carrier material is treated in a material removing manner to obtain a predetermined size and a roughness. Then an activating layer, a pure metal layer and a transition layer composed for example from nitrogen are applied, so that the outermost region of the tool contains a non-metallic hard layer. The non-metallic hard layer has a high hardness and elasticity so that the tool is suitable especially for treating surfaces of structural parts.

9 Claims, 4 Drawing Sheets

TOOL FOR TREATING SURFACES OF STRUCTURAL PARTS AND CARRIER MATERIAL FOR THE SAME

This application is a continuation-in-part of patent application Ser. No. 864,616 filed on Apr. 7, 1992, now U.S. Pat. No. 5,233,738.

BACKGROUND OF THE INVENTION

The present invention relates to a tool for treating surfaces of structural parts and a carrier material for the tool.

It is known to use honing tools for fine treatment of surfaces. Honing tools have relatively complicated constructions. Their surface has a working layer provided with grinding means in particular specially fused aluminum (corundum) or silicon carbide. Spreading cones are provided in the interior of the so-called honing stone, for applying the required pressing force through the honing stone to the wall of the opening.

SUMMARY OF THE INVENTION

Accordingly, it is an object of the present invention to provide a tool for treating surfaces of structural parts, and also a carrier material for such a tool, which avoids the disadvantages of the prior art.

In keeping with these objects and with others which will become apparent hereinafter, one feature of the present invention resides, briefly stated, in a carrier material for a tool for treating surfaces, which is applicable on a non-metallic hard layer and composed of a metal alloy with a homogeneous fine-grained structure and formed as a high pressure sintered material or a heat-drawn superspeed steel.

When the tool and especially the carrier material is formed in accordance with the present invention it has a very homogeneous, very fine-grained and relatively simply alloying construction. It is used as a carrier for a metallic coating which also partially cohesively carries a non-metallic hard layer. In a simple manner, the material can be produced in a material-removing method to obtain a semiproduct with a suitable adjustable roughness. The surface is free from tool contaminations. The applied non-metallic hard layer provides a wear layer with high service life. Since it has no pores, cracks or other defects, it is from free rust and corrosion.

The production of the tool is relatively inexpensive, especially simpler and more price-favorable than the production of known honing tools. The tool can be produced approximately play-free, as a result there is a very small tolerance band. Long and relatively thin tools can be produced. The highly elastic binding of the metal layer by means of an activating layer on the carrier tool prevents microcracks due to inherent tension and due to non-uniformly occurring foreign tension.

In accordance with another feature of the present invention, the superspeed steel which is used for the carrier material can have an average hardness of 68-70 HRC (Rockwell) over the whole diameter.

In accordance with still a further feature of the present invention, the tool for treating surfaces of workpieces has a carrier material specified hereinabove, an activating layer applied on the carrier material, a pure metal layer, a transition layer produced by defusing of carbon and/or nitrogen and/or oxygen with simultaneously supplied further pure metal, and a non-metallic hard layer.

The diffusion of the carbon and/or nitrogen and/or oxygen and the pure metal can be performed by means of PVD-process (physical vapor deposition).

The non-metallic hard layer at least on the surface has a density of 92-98% and a hardness of at least 300% of those of the surface of the structural part to be treated.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
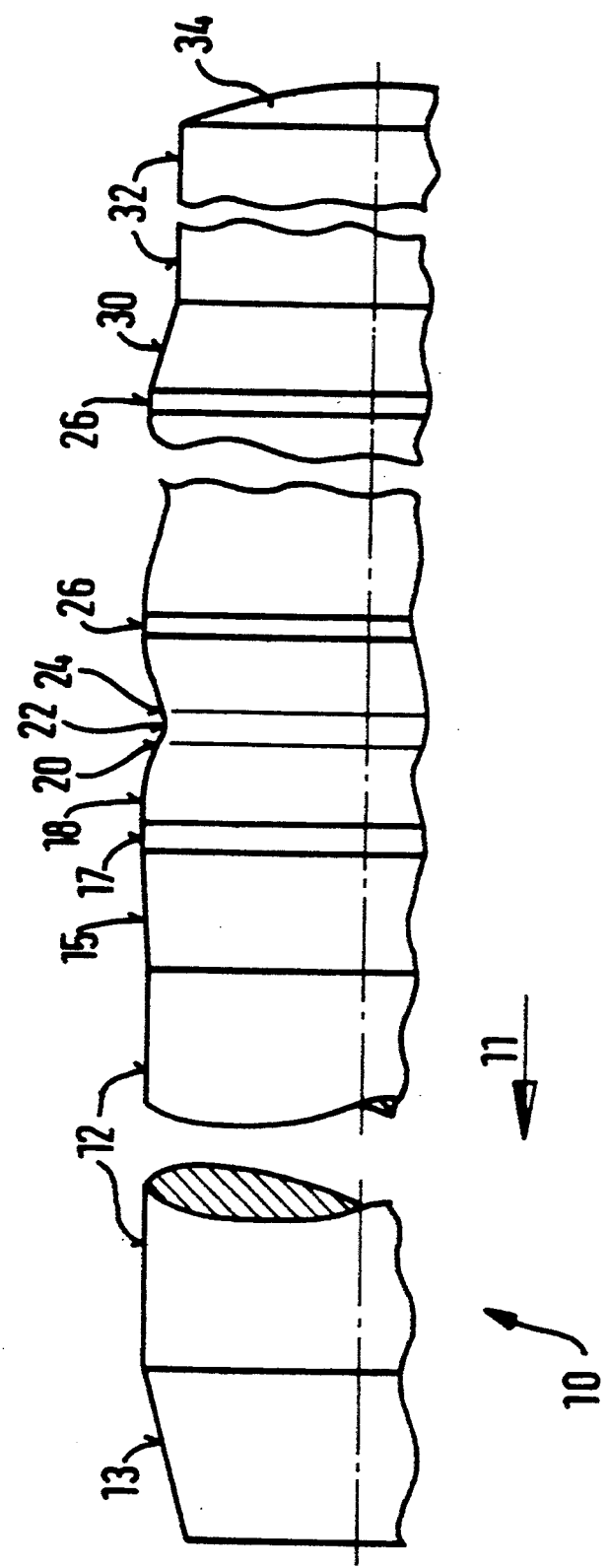
FIG. 1 is a view schematically showing a longitudinal section of a tool for treating surfaces of workpieces in accordance with the present invention, wherein individual regions of the tool are not shown in exact scale.
Figure 2:
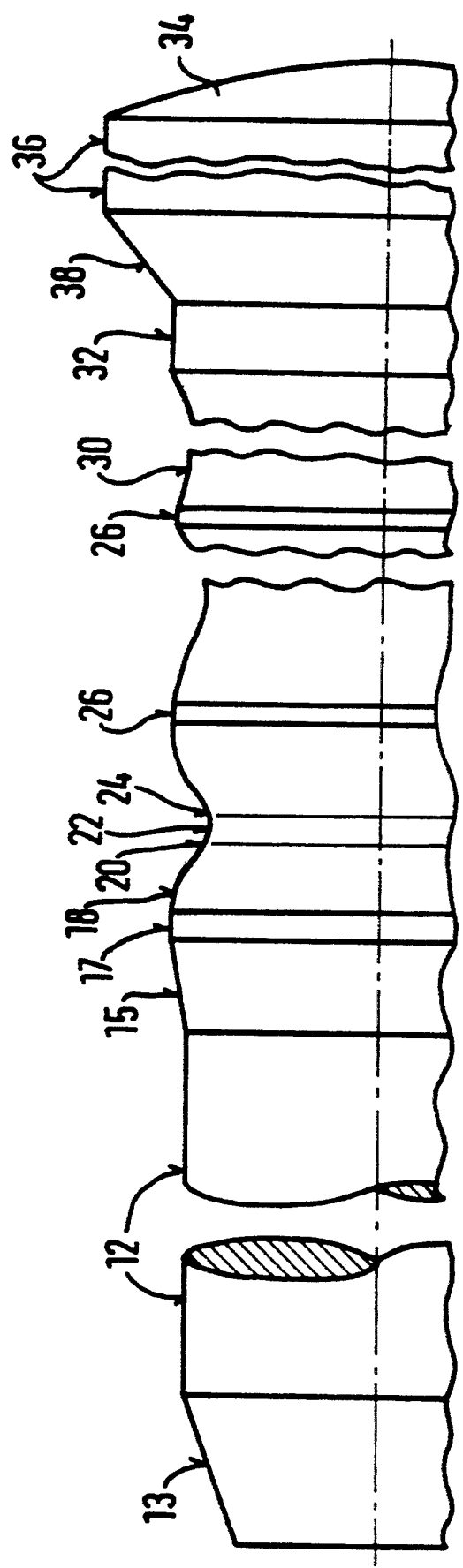
FIGS. 2 and 3 are views showing a tool for treating surfaces of workpieces in accordance with further embodiments of the present invention.

A tool for treating surfaces of structural parts in accordance with the present invention is identified in FIG. 1 with reference numeral 10. It is suitable for simultaneous smoothing and hardening of surfaces. As considered in a working direction which is identified in FIG. 1 with reference numeral 11, the tool has first a centering region 12. The centering region 12 has a conically extending entering region 13 with an inclination of approximately 7°. The entering region 13 serves for introducing the tool without damages for example into an opening. For purposes of explanation a reference will be made always to an opening hereinbelow.

The transition from the entering region 13 to the centering region 12 has a fine radius. It is necessary for preventing a damage to the surface to be treated. The centering region is cylindrical. It is however important that the axis of the tool 10 and the axis of the opening coincide with one another so that the tool 10 does not cant in the opening.

A running in region 15 is connected with the centering region 12 and has an inclination. The inclination of this region is between 0.7° and 2.3°. It is dependent on the material of the tool and also on the material of the structural part to be treated, here for example a valve in which the opening is formed. The values of the inclination can be determined for example empirically. The running in region 15 serves for preventing an undefined scratching by a subsequent working region 17 at the beginning of the opening. A tangential region 18 extends from the running in region 15 to the working region 17. The course of the tangential region 18 corresponds approximately to a greater radius so that it corresponds to a tangent.

The tangential region 18 is needed to avoid a canted transition from the running in region 15 to the working region 17. Since the tangential region 18 has a radius-like shape, a compression of the material of the structural part to be treated is produced. In contrast to an undesired canted transition as mentioned above, the radius of the tangential region 18 does not cause any displacement of the material in micro region in the movement direction 11 of the tool 10, but instead the material is continuously displaced radially outwardly or in other words perpendicular or under 90° relative to the movement direction 11. The radius of the tangential region 18 depends on the material of the structural part and also depends on the ratio between the length and the diameter of the tool 10.

The subsequent working region 17 itself is composed of a cylindrical region with a diameter which is approximately 0.2% greater than the desired diameter of the opening to be treated. This excessive size depends on the material of the structural part and the length of the opening. The width of the working region 17 on the tool 10 corresponds substantially to 0.4% of the diameter of the opening to be treated. A relief region 20 follows the working region 17 and is formed as a curved region. It serves for relieving of the material of the structural part which is treated by the working region 17. The relieving phase is performed in the micro region of the surface of the opening of the structural part. The material of the structural part can be again insignificantly distributed in the relieving region 20.

A collecting trough 22 for foreign bodies is provided after the relief region 20. It collects foreign matter which is located in the opening due to the performed mechanical treatment. The foreign matter can include for example grinding grains or other contaminants or used components of the liquid which is utilized for smoothing the surface of the opening by means of the tool, as will be explained hereinbelow. The collecting trough 22 is radius-shaped and its radius is dependent on the diameter and the length of the tool. A continuous transition from the relief region 20 to the collecting trough 22, as in the event of a composite curve in a mathematical consideration, is important for a damage-free reverse movement of the tool from the opening. The subsequent region 24 corresponds to the relief region 20 as to its shape, action and purpose. If an imaginary mirror axis is extended through the minimum, or in other words through the deepest point of the collecting trough 22, then the transition from the collecting trough 22 in the region 24 and the region 24 itself is a mirror-symmetrical repeat of the relief region 20 and the transition from the relief region 20 to collecting trough 22. This means that the region 22 continuously merges into a second working region 26, similarly to the transition of the working region 17 to the relief region 20.

The working region 26 has only approximately 60% of the length of the working region 17. Its diameter however corresponds exactly to the diameter of the working region 17. Up to the length of the working regions 26 and 17, the region of transition from the collecting trough 22 to the region 24, the region 24 itself, and the working region 26 are mirror-symmetrical of the region 17, 20, 22. The working region 26 and the regions located between the working regions 17 and 26 repeat themselves identically so often, until the length of the part to be treated is obtained. The repeated working region 26 extends over 60% of the length of the first working region 17. The last working region 26 is followed by a running out region 30 which has an inclination angle is somewhat greater than the inclination angle of the running in region 15. The angle of inclination is between 3° and 7°. It serves as an expansion region for the treated material of the structural part.

The transition from the running out region 30 to the running out cylinder 32 is radius shaped to avoid a breakage danger for the tool. The length of the running out cylinder 32 substantially corresponds to 60% of the centering region 12. The diameter of the running out cylinder 32 is substantially 0.5%–1% smaller than the diameter of the working region 17 or 26. This means that the diameter of the running out cylinder 32 is smaller than the diameter of the centering region 12. In some cases however it can be equal to the diameter of the working regions.

The end of the tool 10 is formed as a callotte 34 for force introduction and force transmission of the displacement movement for the tool 10 in direction of the arrow 11. The callotte 34 is formed so that a point-like force introduction, for example by means of automatic press is possible. The radius is determined empirically and depends on the length and the diameter of the tool 10. In mathematical sense, the callotte 34 with a small diameter of the tool 10 has the shape of a composite arc. In other words the size surfaces of the callotte 34 extend steeper than a radius-like shape. This is required especially in the case of tools with greater length and smaller diameters. Further, the callotte 34 is formed mirror-symmetrical relative to an imaginary mirror axis extending through the tip of the callotte 34.

The above described regions of the tool are important portions which are available always, depending on the utilization of the tool. If the tool is used for treating a throughgoing opening, the centering region 12 as above described, is formed directly on the tool. Alternatively, a centering region can be arranged on a structural part to be treated. The working part or part of the tool are connected with the centering region 12. It is composed of the regions from the working region 17 to the working region 26, and this working part is repeated many times. As mentioned above, then after the first repeat the working region 26 always has the same length which however is only 60% of the length of the first working region 17 connected with the running in region 15. The working part is composed of several stages, and the working regions 17 and 26 of the individual stages always have a greater diameter. The diameter increases from stage to stage non-linearly but instead the increase of the diameter of the working regions 17, 26 and 17a, 26a is curve-shaped over the whole length of the tool and has the shape of for example logarithmic or a potentially extending curve. The exact shape of the tool is determined empirically.

The last stage, or in other words the working region 26 is then adjusted to the diameter of the treated opening with the required total oversize or overmeasure (the oversize increases per stage also). The working region 26 is followed by the running out region 30, the running out cylinder 32 and the callotte 34.

In a variation of the tool, it can be used for treating a blind hole. In this case it is necessary to withdraw the tool from the blind hole, and therefore a region for engaging a tool is needed. For this purpose a pulling region 36 is arranged between the running out cylinder 32 and the callotte 34. The pulling region 36 is formed for example as a two-faced or four-faced structure. For a reliable pulling out of the tool 10, the surface of the pulling region 36 can be provided with some roughness.

In accordance with another variation, also seats and shoulders can be formed in the opening by the tool. For this purpose the tool is provided with a seat 38 located after the working region 26 and corresponding to the size of the desired seat of the opening. The inclination of the seat 38 is, depending on the material of the structural part, by substantially 0.5% greater than the inclination of the seat to be produced. This is necessary due to the springing back of the material and the structural part. The running out cylinder 32 follows the seat 38.

Figure 3:
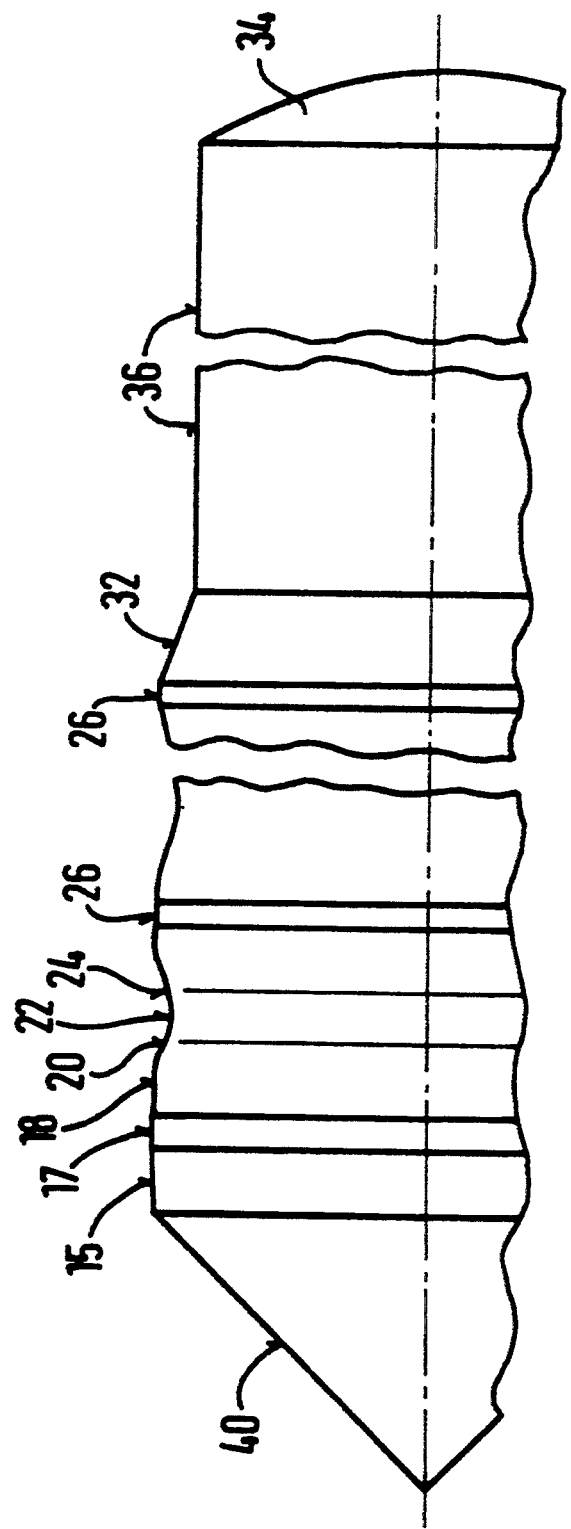

For forming the seat of injection valves it is recommended to provide the seat before the entering region 13 and before the centering region 12. Both regions 13 and 12 in the case of the preceding seat 40 have a very small length or can even be dispensed with as shown in FIG. 3. Only the working region 17 and the subsequent above described regions follow the seat in this case. Further, a stepped working region with a seat suitable for forming a seat in the structural part can be utilized. The above described working region and in some cases seat can be combined in an arbitrary manner in a tool.

In order to harden and smooth a surface with the above described tool, the tool 10 must be composed of a predetermined material and the tool end must be provided with an edge layer applied in a special process. A base body 50 of the tool 10 must be composed of a metal with a homogeneous fine-grain structure. If a thin tool with a diameter of substantially 2–12 mm is to be produced, a high pressure sintered semiproduct is utilized or in other words a carrier which is produced in a high pressure sintering process. For thicker tools superspeed steels are utilized. In all cases the tool is produced with a diameter which is substantially 40% greater than the desired diameter for the subsequent working region 17, 26. In this region which extends outwardly beyond the desired diameter, contaminations and decarbonizations are located, which are produced during the manufacture of the semiproduct, both for a thick and for a thin tool. This 40% excess of the diameter is removed mechanically for example by milling. The thusly produced surface must be however as smooth as possible. After milling a relatively homogeneous carrier or base tool 50 is produced in the center. Further, the remaining material for the tool is compressed by the mechanical treatment. This means that the grains are melted with one another better so as to obtain a more compressed structure. The thusly produced semiproduct for the tool serves as an initial material for producing or applying a non-metallic hard layer 51. The hard layer together with the above described geometric shape of the tool 10 is important for the quality, the hardness and the smoothness of the treated surface.

Figure 4:
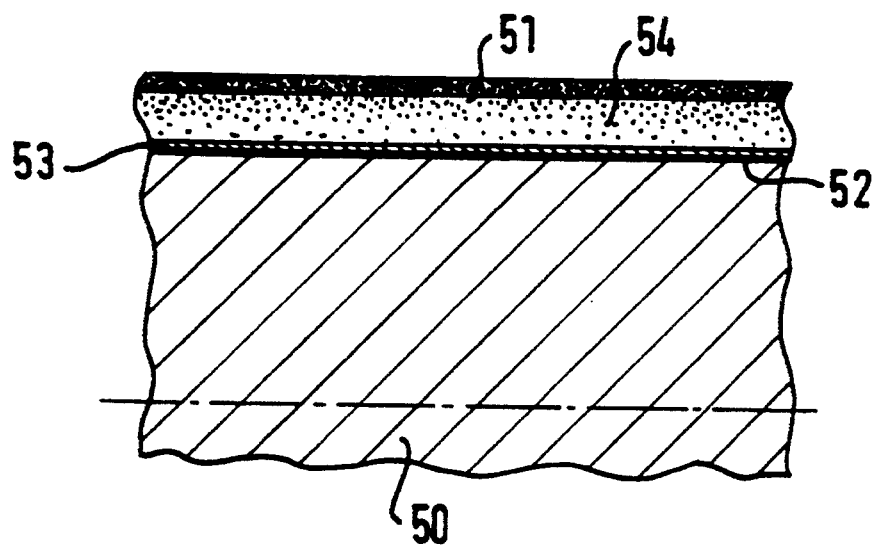
FIG. 4 is a view showing a layered structure of a hard layer on a base material of the tool of the present invention.

The object is to provide at the end of the working phase a non-metallic hard layer on the outer wall or in other words on the so-called working surface of the tool. This non-metallic hard layer 51 is however applied on a metallic carrier material 50 as described hereinabove. A corresponding construction of the tool 10 is shown in FIG. 4. Here the carrier material is identified with 50, and it is produced with a homogeneous, fine-grain structure in the above described manner. It is important that the surface of the carrier material 50 is as smooth as possible and over its whole length has the same size. A thin activating layer 52 with a thickness of approximately 0.2–0.3 micrometer is applied on the carrier material. The activating layer 52 is composed for example of platinum, palladium, zinc, nickel, silver or gold. Naturally, also compounds of these materials are acceptable. The activating layer 52 is arranged in form of a net over the whole outer surface of the carrier material 50. In other words, the activating layer cannot be closed and does not form a completely closed surface on the carrier material 50. The activating layer 52 is applied in electrolytic-chemical process. This means that in contrast to an electrolytic process (physical process) the electrolyte also performs an additional cleaning action.

The activating layer 52 is cohesive and composed of a soft material. It is cohesively connected with the material of the carrier 50 and must be also cohesively connected with the subsequent pure metal layer 53. The ions of the activating layer 52 defuse into the carrier material 50. Thereby an elastic intermediate layer is produced, which is connected as a net of the activating layer 52 with the carrier material 50. Subsequently, a pure metal layer 53 composed for example of titanium, chromium, boron or tungsten can be applied on the activating layer 52. The pure metal layer is applied by ion exchange or sputtering (PVD-processes or in other words by physical vapor deposition). Simultaneously, the produced layer is connected by melting in a light arc. It is performed until an average layer of 0.3–0.5 micrometer is produced on the activating layer 52. The pure metal layer 53 is cohesively connected with the carrier material 50 through the activating layer 52 and also is partially cohesively connected with the subsequent non-metallic hard layer 51.

When the pure metal layer 53 reaches its average layer thickness, in a certain way carbon and/or nitrogen ions are supplied so as to form the non-metallic hard layer 51 over a transition layer 54. The carbon or nitrogen ions are supplied in a so-called PVD-process (physical vapor deposition) in vacuum for example at least $10^{-3}$ bar or high vacuum. The fraction of the supplied components of nitrogen and carbon radially outwardly continuously increases, for example toward the non-metallic hard layer 51. The transition region 54 is connected with the homogeneous non-metallic hard layer 51 having a density of approximately 95–98%. The non-metallic hard layer 51 is composed of a metal carbon-nitrogen compound or metal carbon compound or metal nitrogen compound (nitride alloying). For example with titanium, the hard layer 51 can be composed of TiN or Ti(CN).

For treating surfaces with the above described tool 10 an ion-lubricant substance must be utilized. The substance has the purpose of lubricating, cooling, and alloying the surface to be treated. It is known to use for this three processes corresponding separate substances, while in contrast in applicant's invention all three objectives are achieved with the single substane. The substance is identified as ion-lubricant substance in view of its composition and its function. The ion-lubricant substance has a carrier liquid which is composed mainly of organic, acid-free oils, for example rape seed oil. The remaining component is a synthetic mineral oil, for example acid-free, chlorine-free oil. Due to the combination of both above mentioned components the viscosity of the ion lubricant substance is adjusted to be liquid or in other words in the region of 9–12 Ctst (centistock). The exact composition of course depends on the material of the workpiece to be treated. This means that instead of the organic oil, also inorganic oil can be utilized. At least 15 volume percent of fine soot and at least 17 volume percent of fine graphite are introduced in the thusly prepared ion-lubricant substance. Subsequently, the mixture is filtered (grain size maximum 0.3 micrometer), so as to obtain the ion lubricant substance with maximum liquid properties. Also, a fine and uniform distribution of both above mentioned components including the fine soot and the fine graphite must be guaranteed.

The ion lubricant substance is determined by the workpiece to be treated and also by its alloying function. This means that different metal ions must be added which are easily alloyable in the material of the workpiece to be treated such as for example zinc, gold, silver, palladium, nickel. The thusly produced substance is stirred and then applied in small quantities on the tool 10. A drop of the ion-lubricant substance is sufficient. The surface of the workpiece can be treated with the tool 10 having the above described geometry and composition and with the ion-lubricant substance in the process described hereinbelow.

A small quantity of the ion-lubricant substance is applied on the tool 10. Then the tool 10 is introduced into the opening with its entering region 13 and centering region 12. The tool 10 is displaced with an exceptionally well centering in the opening by means of an automatic press and then through the opening. A predetermined average speed is required for obtaining a warming up in the surface structure of the opening. This warming is needed due to hard layer 51. Hard materials in cold condition are cracked during the displacement through the structural parts. In contrast, when the warming up is performed a material equalization is obtained during the passage of the tool, or in other words a filling of the working grooves. Due to the ion-lubricant substance low friction is produced when the hard layer 51 of the tool 10 moves over non-uniform areas of the opening. The releasing ions are bonded in the material of the structural part. Therefore, a cohesive binding is obtained by ion-lubricant substance and the components of the surface of the structural part can no longer "fall out".

In the variant for forming the seat, the tool 10 is inserted in the opening until the seat of the tool 10 abuts against the shoulder of the opening to be treated. Then the tool is turned several times and subsequently removed from the opening.

The above described tool with several stages is especially used for nonroundness of the opening or excessive roughness of the surface of the opening in the structural part. The different steps must be designed in dependence on the length of the opening to be treated with respect to the diameter of the opening.

It will be understood that each of the elements described above, or two or more together, may also find a useful application in other types of constructions differing from the types described above.

While the invention has been illustrated and described as embodied in a carrier material for a tool, and a tool for treating surfaces, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A carrier material for a tool for treating surfaces, on which a non-metallic hard layer is to be applied, the carrier material being composed of a metal alloy with a homogeneous fine-grained structure and formed as a high pressure sintered material; and an activating layer applied on said metal alloy and cohesively connected with said metal alloy.

2. A carrier material for a tool for treating surfaces, on which a non-metallic hard layer is to be applied, the carrier material being composed of a metal alloy with a homogeneous fine-grained structure and formed as a heat-drawn superspeed steel material; and an activating layer applied on said metal alloy and cohesively connected with said metal alloy.

3. A tool for treating surfaces of structural parts comprising a carrier material which is composed of a metal alloy with a homogenous fine-grained structure and formed as a material selected from the group consisting of a high pressure sintered material and a superspeed steel material; a non-metallic hard layer applied on said carrier material; and an activating layer applied on said carrier material between said carrier material and said hard layer and cohesively connected with said carrier material.

4. A carrier material as defined in claim 3, wherein said superspeed steel material has an average hardness of 68–70 HRC over its whole diameter.

5. A tool as defined in claim 3; and further comprising a pure metal layer, a transition layer produced by diffusing a gas selected from the group consisting of carbon, nitrogen and oxygen with simultaneously supplied further pure metal, wherein said non-metallic hard layer being applied on said transition layer, and said activating layer being cohesively connected with said pure metal layer.

6. A tool as defined in claim 5, wherein said transition layer is a physical-vapor deposited layer with the gas and the further pure metal.

7. A tool as defined in claim 3, wherein said non-metallic hard layer at least on a surface has a density of 92–98% and a hardness of at least 300% of those of the surface of the structural part to be treated, 8. A carrier material for a tool for treating surfaces, on which a non-metallic hard layer is to be applied, the carrier material including a metal alloy with a homogeneous fine-grain structure; and an activating layer applied in form of a net over said metal alloy and cohesively connected with said metal alloy.

9. A tool for treating surfaces of structural parts comprising a carrier material which is composed of a metal alloy with a homogenous fine-grained structure and formed as a material selected from the group consisting of a high pressure sintered material and a superspeed steel material; a non-metallic hard layer applied on said carrier material; and an activating layer applied on said carrier material between said carrier material and said hard layer, said superspeed steel material having an average hardness of 68–70 HRC over its whole diameter.

* * * * *